(12) United States Patent
Bachmaier et al.

(10) Patent No.: US 12,006,956 B2
(45) Date of Patent: Jun. 11, 2024

(54) ACTUATOR DEVICE AND STOPPING AND UNLOCKING METHOD

(71) Applicant: METISMOTION GMBH, Munich (DE)

(72) Inventors: Georg Bachmaier, Munich (DE); Patrick Froese, Munich (DE); Matthias Gerlich, Munich (DE); Wolfgang Zoels, Munich-Lochhausen (DE)

(73) Assignee: METISMOTION GMBH, Munich (DE)

( * ) Notice: Subject to any disclaimer, the term of this patent is extended or adjusted under 35 U.S.C. 154(b) by 66 days.

(21) Appl. No.: 16/761,556

(22) PCT Filed: Nov. 14, 2018

(86) PCT No.: PCT/EP2018/081249
§ 371 (c)(1),
(2) Date: May 5, 2020

(87) PCT Pub. No.: WO2019/101601
PCT Pub. Date: May 31, 2019

(65) Prior Publication Data
US 2021/0172464 A1 Jun. 10, 2021

(30) Foreign Application Priority Data

Nov. 27, 2017 (EP) ..................................... 17203689

(51) Int. Cl.
*F15B 7/00* (2006.01)
*F15B 21/06* (2006.01)
(Continued)

(52) U.S. Cl.
CPC ................ *F15B 7/00* (2013.01); *F15B 21/06* (2013.01); *H10N 30/20* (2023.02); *H10N 30/50* (2023.02); *H10N 35/00* (2023.02)

(58) Field of Classification Search
CPC ............... F15B 7/001; F15B 7/00; F15B 7/08
See application file for complete search history.

(56) References Cited

U.S. PATENT DOCUMENTS 3,507,507 A * 4/1970 Tobler ................... B23B 31/305
279/2.08
4,729,730 A * 3/1988 Hatayama ............... F15B 21/06
425/405.2
(Continued)

FOREIGN PATENT DOCUMENTS

CN 104343928 A 2/2015
CN 105284041 A 1/2016
(Continued)

OTHER PUBLICATIONS

DE 19854348 C1 machine translation to English from espacenet (Year: 2000).*
(Continued)

*Primary Examiner* — Kenneth Bomberg
*Assistant Examiner* — Michael Quandt
(74) *Attorney, Agent, or Firm* — FITCH EVEN TABIN & FLANNERY, LLP (57) ABSTRACT

The invention relates to an actuator device comprising at least one solid-state actuator and a hydraulic unit connected mechanically to the solid-state actuator in series, wherein said hydraulic unit comprises a hydraulic volume which is filled with a hydraulic fluid. In the method of clamping a clamping body, an actuator device of this type is used and
(Continued)

the solid-state actuator of the actuator device is controlled, in particular, depending on a movement variable of the clamping body.

10 Claims, 3 Drawing Sheets

(51) Int. Cl.
*H10N 30/20* (2023.01)
*H10N 30/50* (2023.01)
*H10N 35/00* (2023.01)

(56) References Cited

U.S. PATENT DOCUMENTS

| | | | |
|---|---|---|---|
| 5,063,542 A | | 11/1991 | Petermann et al. |
| 5,800,060 A | | 9/1998 | Speckbrock et al. |
| 6,000,687 A | * | 12/1999 | Andre ............... F15B 7/00 269/22 |
| 6,052,992 A | * | 4/2000 | Eroshenko ........... F28D 20/023 60/527 |
| 7,726,972 B1 | | 6/2010 | Brandenburg et al. |
| 2010/0095669 A1 | | 4/2010 | Loveday |
| 2015/0113976 A1 | * | 4/2015 | Bachmaier ............ F15B 7/08 60/545 |
| 2015/0345519 A1 | | 12/2015 | Vetrovec |

FOREIGN PATENT DOCUMENTS

| | | | | |
|---|---|---|---|---|
| DE | 19535081 A1 | | 3/1997 | |
| DE | 19854348 C1 | * | 4/2000 | ............ B23Q 1/265 |
| DE | 19854348 C1 | | 4/2000 | |
| DE | 102015100801 A1 | | 7/2016 | |
| EP | 0856391 A1 | | 8/1998 | |
| EP | 0886064 A1 | | 12/1998 | |
| JP | S5864391 A | | 10/1981 | |
| JP | S62102952 A | * | 5/1987 | ............ B23Q 1/34 |
| JP | S63235708 A | | 9/1988 | |
| WO | 2016050490 A1 | | 8/2010 | |

OTHER PUBLICATIONS

JP S62102952 A machine translation to English from espacenet (Year: 1987).*
PCT; App. No. PCT/EP2018/081249; International Search Report and Written Opinion dated Mar. 15, 2019.
JPO; App. No. 2020-545858; First Office Action dated May 26, 2021.
CNIPA; Chinese Supplementary Search Report from Chinese Application No. 201880076654.9; dated Jul. 26, 2023 (2 pages).
CNIPA; Chinese Office Action from Chinese Application No. 201880076654.9; dated Aug. 4, 2023 (24 pages).
CNIPA; Chinese Search Report from Chinese Application No. 201880076654.9; dated Dec. 19, 2022 (3 pages).
CNIPA; Chinese Office Action from Chinese Application No. 201880076654.9; dated Dec. 19, 2022 (12 pages).
Examination Report from EPO Application No. 18 810 902.9; dated Oct. 25, 2023; In German with English translation (8 pages).
Examination Report from EPO Application No. 17 203 689.9; dated Nov. 10, 2023; In German with English translation (8 pages).

* cited by examiner

ACTUATOR DEVICE AND STOPPING AND UNLOCKING METHOD

CROSS-REFERENCE TO RELATED APPLICATIONS

This application is a U.S. national phase application of International Application No. PCT/EP2018/081249, filed Nov. 14, 2018, designating the United States, which claims priority to EPO Application No. 17203689.8, filed Nov. 27, 2017.

FIELD

The invention relates to an actuator device for arresting and unlocking.

The invention relates to an actuator device as well as to a method for arresting an arresting body and for unlocking the arresting body.

BACKGROUND

In the employment of tools or other apparatuses, there is a necessity in many cases to accomplish a sudden arrest of moved parts of the tool or the appliance. Such a necessity often results from safety considerations, for instance in case of electrical saws. For example, if a hand of a user gets onto the saw, thus, the saw is to be stopped. Therein, a low-delay arrest for instance of the saw blade is in particular relevant since each additional millisecond of delay before arrest can cause a great damage. Accordingly, actuator devices are required for such applications, which allow arresting movable parts of the tool or the apparatus within few milliseconds.

Actuator devices are known, which electromechanically operate. Such actuator devices regularly have actuating times of more than 10 milliseconds and accordingly operate too slowly.

Alternatively, actuator devices are known, which include a chemical explosion drive. However, such actuator devices are not sufficiently safely operable on the one hand. On the other hand, such actuator devices are only poorly controllable or regulable.

Therefore, it is the object of the invention to provide an actuator device, by which arresting and thereby fixing a movable arresting body is sufficiently fast possible in controlled manner. Further, it is the object of the invention to specify a method for arresting an arresting body, which can be sufficiently fast and operationally reliably executed.

SUMMARY

This object of the invention is solved by an actuator device and a method with the features specified in the independent claims. Preferred developments of the invention are specified in the associated dependent claims, the following description and the drawing.

The actuator device according to the invention is formed for arresting and includes a solid-state actuator and a hydraulic unit mechanically connected in series with the solid-state actuator. Therein, the hydraulic unit of the actuator device according to the invention has a hydraulic volume, which is fillable and preferably filled with a hydraulic fluid.

In particular, the hydraulic volume can be substantially completely filled with the hydraulic fluid. Preferably, the hydraulic fluid should fill the hydraulic volume as far as a transfer of force and/or mechanical movement energy between various elements of the hydraulic unit (in particular between a drive element and an output element) is allowed by this hydraulic fluid.

In the present context, it is to be understood by the mentioned feature that the solid-state actuator is "mechanically connected in series" with the hydraulic unit, that solid-state actuator and hydraulic unit are connected such that a mechanical movement of a part of the solid-state actuator is transferable to a corresponding part of the hydraulic unit. In particular, the hydraulic unit is configured to transfer this movement of the corresponding part of the hydraulic device to an, in particular external, element to be moved, wherein such a transfer can generally be associated with a certain transmission ratio and/or with an integration of multiple individual movements. This element preferably comprises a clamping surface for clamping the arresting body in the form of a clamping body and/or a projection for locking, i.e. for form-fit fixing, the arresting body in the form of a form-fit body. I.e., in the sense of the present invention, clamping is preferably to be understood by arresting, wherein an arresting body in the form of a clamping body can be fixed by means of the actuator device. Alternatively or additionally, in the sense of this invention, form-fit arresting, thus locking, can be able to be understood by arresting, wherein the arresting body can be fixed by means of the hydraulic unit and preferably the, in particular additional, element in form-fit manner and thus forms a form-fit body. Suitably, the form-fit body includes a recess and the element includes a projection corresponding to the recess. Alternatively and also preferably, the element includes a recess and the form-fit body includes a projection corresponding to the recess. This element can be a constituent of the hydraulic unit or be an additional, i.e. "external", element, which is mechanically connected in series with the hydraulic unit. Preferably, this element is a constituent of the actuator device according to the invention.

Advantageously, solid-state actuators, as they are provided in the actuator device according to the invention, have high mechanical eigenfrequencies and thereby short actuating times with high actuating forces at the same time. In particular, the deflecting times of such solid-state actuators can be at least 20 microseconds, preferably at most 50 microseconds and/or at most 100 milliseconds. By means of the hydraulic unit connected in series, provided in the actuator device according to the invention, a deflection of the solid-state actuator is additionally transferable in particularly low-delay and nearly loss-free manner such that a nearly instantaneous arrest of the arresting body can be effected by means of the actuator device as a result of control of the solid-state actuator. Accordingly, the arresting body can either be released or be prevented from its movement without considerable time delay. Thus, it can be particularly fast switched by means of the actuator device according to the invention. According to the invention, the arresting time and/or unlocking time can suitably be at least 50 microseconds and/or at most 100 milliseconds.

Advantageously, the actuator device according to the invention is non-destructively usable. In particular compared to explosion drives, the actuator device according to the invention is therefore usable not only once, but in repeated manner. Because the actuator device according to the invention can be restored into the original state such that the actuator device is newly employable. Further advantageously, the actuator device according to the invention can be employed without damage to optionally present peripheral devices and thus in particularly operationally reliable manner due to the omission of explosion drives.

Due to the hydraulic unit provided according to the invention, the actuator device according to the invention is additionally formed mechanically low in wear.

Preferably, the actuator device according to the invention additionally includes an arresting body, which can be arrested by the actuator device. Alternatively, an arresting body can be arrested, which is not necessarily part of the actuator device according to the invention.

In a preferred development of the invention, the actuator device comprises a spring element and/or a drive element, which is arranged and formed for force application on the arresting body and/or for driving the arresting body, in particular on the arresting body. In this manner, the arresting body can be applied with a high force, which can accelerate the arresting body if it is not arrested. If the arresting body is arrested and thus fixed in its movement in or by means of the actuator device according to the invention, movements of the arresting body can be fast initiated and/or inhibited by means of or in the actuator device according to the invention.

Conveniently, the spring element or drive element comprises a pressure accumulator and/or a magnet and/or a spring in the actuator device according to the invention. By means of a pressure accumulator and/or a magnet and/or by means of springs, the arresting body can advantageously be applied with a high force in constructively simple manner.

Suitably, the actuator device according to the invention comprises at least one clamping surface, which is formed for frictional engagement in particular with the arresting body in the form of a clamping body. In this development of the invention, the arresting body can be easily fixed in its movement by force application in the direction obliquely, in particular perpendicularly to a preset direction of movement of the arresting body. It is understood that the movement of the arresting body does not have to be a center of gravity movement of the arresting body. Basically, it is also sufficient and possible that a surface of the arresting body is movable and fixable by arresting with respect to the hydraulic unit, for instance in case of a pure rotation of the arresting body, which exactly does not include a center of gravity movement of the arresting body.

In case of arresting in the form of clamping, the actuator device according to the invention is preferably formed to circumferentially, preferably fully circumferentially, clamp the clamping body. By means of a circumferential clamping of the clamping body, a large contact surface for frictionally fixing the clamping body is usable. Accordingly, particularly large clamping forces on the clamping body can be realized in this development of the invention.

Preferably, the arresting body has a cylindrical, preferably circularly cylindrical, shape except for recesses and/or projections optionally provided for form-fit and suitably forms a shaft. Alternatively or additionally, the arresting body has a polygonal cross-section. Conveniently, in the arresting body, in case of arresting in the form of clamping, thus in the clamping body, the clamping surface has a shape completely or at least partially corresponding to the clamping body. In this development, a clamping sleeve is thus advantageously realized.

By means of the clamping sleeve realized in this development, clamping forces of several kilonewtons can be achieved by the actuator device according to the invention. In case of arresting by means of form-fit, similar retaining forces can be achieved. However, the energy, which is required for switching such clamping forces, is only about 1 Joule. Accordingly, high switching forces can be controlled by means of particularly low energies, for example provided by means of batteries as in particular button cells, by means of the actuator device according to the invention. The actuator device according to the invention can be employed similar to an electrically operable retaining magnet, in particular with respect to the provided purposes of employment, in particular if the actuator device comprises a clamping body.

In a preferred development of the invention, the hydraulic fluid is or includes a liquid metal in the actuator device according to the invention.

Here, a metal (thus a metallic element or also an alloy of multiple metallic elements) is to be understood by a liquid metal, which has a liquid aggregate state in an operating state of the actuator device. For example, the liquid metal can be present in a liquid state at room temperature and at the operating pressure of the hydraulic unit. Particularly advantageously, it can also be present in a liquid state at lower temperatures than the room temperature or the operating temperature of the actuator device according to the invention, however, this is not necessarily required for the function of the invention.

An essential advantage of this development of the actuator device according to the invention is in that a liquid metal has a considerably lower compressibility compared to conventional hydraulic fluids. Hereby, mechanical losses are reduced and the efficiency of the actuator device according to the invention is increased compared to the prior art. A further advantage of the actuator device according to the invention is in that the thermal expansion coefficient of a liquid metal is generally considerably lower than in conventional hydraulic fluids. Hereby, mechanical state changes of the hydraulic unit caused by temperature variations are advantageously reduced. The viscosity and the density of a liquid metal are typically higher than those of a conventional hydraulic fluid. However, the disadvantages associated therewith can be accepted to achieve the mentioned advantages in the operation of the actuator device. In particular in the typically relatively low liquid volume in the hydraulic unit of such an actuator device, the occurring increases of viscosity and/or density of the hydraulic fluid can be well tolerated.

Advantageously, in this development, the actuator device according to the invention is therefore extremely robust with respect to mechanical tolerances and temperature expansions due to the mostly incompressible hydraulic fluid as well as due to the comparatively low thermal expansion coefficient.

Due to the capability of formation of the hydraulic unit with a low volume as well as the low compressibility of the hydraulic fluid, the actuator device according to the invention additionally has particularly low eigenfrequencies in this development such that actuation times of considerably below one microsecond are possible.

Advantageously, the hydraulic fluid can include gallium and/or indium and/or tin and/or mercury. Such metals are advantageously suitable components to achieve a low melting point in a metallic alloy. Particularly advantageously, the hydraulic fluid comprises both gallium and indium and tin. According to a particularly preferred development of the invention, it is even composed exclusively of the three mentioned metals. In particular, the hydraulic fluid can be an alloy, which is known under the name Galinstan among experts. Galinstan is a eutectic alloy, which comprises about 68.5 percent by weight of gallium as well as about 21.5 percent by weight of indium and about 10 percent by weight of tin. Such an alloy has a very low melting point of about −19° C. Other suitable low-melting alloys are in particular obtainable from the US-American enterprise Indium Corporation in Utica, N.Y., under the name Indalloy 51 and Indalloy 60. Further suitable gallium-based alloys are in particular those alloys, which are described in the patent specifications U.S. Pat. Nos. 5,800,060B1 and 7,726,972B1. Besides the three mentioned particularly preferred metals, they can also include additives of other metals such as for example zinc (in particular between about 2 and 10 percent by weight).

The described alloys, which are formed with gallium and/or indium and/or tin, have the advantage that they have a low toxicity and thus are relatively harmless with respect to health and environmental damages. Mercury is also a suitable liquid metal or a suitable alloy constituent for low-melting alloys, but has the fundamental disadvantage that it is highly toxic. However, since the hydraulic volume of the hydraulic unit of the actuator device basically can be very well hermetically sealed against the outer environment, the use of mercury or mercury containing alloys is basically also not excluded and can also be advantageous for certain applications. Generally and independently of their exact composition, the hydraulic fluid can be a eutectic alloy. Such an alloy is particularly preferred since a substantially lower melting point can be achieved with it than with its individual metallic components.

Furthermore, it is generally particularly preferred if the hydraulic fluid is liquid at normal pressure at a temperature of 20° C., conveniently at 0° C., in particular even at −10° C. and ideally at −20° C. In other words, the liquid metal is then in liquid state at least down to the mentioned temperature and possibly even at lower temperatures. Such a low-melting liquid metal is particularly well suitable as a hydraulic fluid for the described application even if the operating temperature of the actuator device according to the invention is considerably above the mentioned temperature. In any case, at such a low melting temperature, the choice of the operating temperature for the actuator device according to the invention is not particularly severely restricted. For the operation of the actuator device, it is generally advantageous if the operating temperature is not only slightly, but considerably above the melting temperature of the used liquid metal. For example, the distance between operating temperature and melting temperature can be at least 10° C. Such a safety distance in the temperature in particular also beneficially affects the viscosity of the hydraulic fluid since the viscosity is then lower than in immediate vicinity of the melting point. Alternatively or additionally and also preferably, the hydraulic fluid is liquid at an operating temperature and at an operating pressure of the actuator device.

According to a preferred development of the invention, the compression modulus of the hydraulic fluid is above 10 GPa, for example between 20 GPa and 60 GPa. Such a high compression modulus can be easily achieved by the use of a liquid metal and entails that the mechanical losses in the hydraulic unit are low and that the efficiency of the actuator device is correspondingly high.

According to a further preferred development of the invention, the thermal expansion coefficient of the hydraulic fluid is below 0.001 1/K, in particular below 0.00015 1/K. Such a low thermal expansion coefficient can be easily achieved by the use of a liquid metal and entails that temperature variations in the operation of the actuator device only result in slight position variations in the individual elements of the hydraulic device.

According to a further generally preferred development of the invention, the viscosity of the liquid metal is above 0.5 mm$^2$/s, for example between 1 mm$^2$/s and 100 mm$^2$/s. Such a high viscosity contributes to reduction of leakages between the individual line parts and thus to maintenance of the required pressure gradients.

According to a further generally preferred development of the invention, the density of the liquid metal is below 8 g/cm$^3$, for example between 5 g/cm$^3$ and 7 g/cm$^3$. Such a low density contributes to reduction of the losses in the hydraulic unit and thus to a good efficiency of the actuator device.

The material parameters mentioned here for the liquid metal as the hydraulic fluid each are to apply to the operating conditions of the actuator device, thus to the operating temperature and operating pressure thereof. Therein, the operating temperature can in particular be at room temperature and the material parameters can be specified as parameters at room temperature.

The hydraulic volume of the hydraulic device, which substantially corresponds to the used fluid volume for the preferably used liquid metal, can generally preferably be below 10 milliliters. Such a low fluid volume is generally advantageous to keep the mechanical losses (in particular friction losses and compression losses) of the hydraulic fluid as low as possible in the operation of the hydraulic unit. This generally also applies to conventional hydraulic fluids. However, in combination with the advantageous characteristics of a liquid metal, the mentioned low fluid amounts advantageously contribute all the more to reduce the losses and thermal influences to a minimum.

The bounding walls of the hydraulic volume, in particular of the drive and output chambers and hydraulic line(s) of the hydraulic unit, are particularly advantageously formed of or with a material and/or coated with a material, which is chemically resistant also with permanent contact with the preferably used respective liquid metal. Many metals are susceptible to corrosion upon longer contact with liquid gallium or gallium containing alloys. In order to protect the bounding walls from such a corrosion, they can be formed of a resistant material and/or provided with a resistant protective layer. Suitable resistant materials are refractory metals like tantalum, tungsten or ruthenium. However, sufficiently pure iron or steel (in particular the material, which is sold by the company Carpenter Steel under the name Consumet), nickel, titanium nitride (TiN) or diamond-like coatings can also be resistant against gallium containing liquid metals to a high degree.

Generally preferably, the hydraulic unit is formed to transfer a movement originating from the solid-state actuator to an element to be moved, in particular a clamping jaw formed for clamping, or a form-fit element provided with a projection and/or a recess, which is formed for fixing an arresting body by means of form-fit, with a transmission ratio of unequal to 1. Therein, the mentioned "element to be moved" does not necessarily have to be part of the hydraulic unit. The transmission ratio can in particular be selected less than 1 such that the mechanical stroke on the exit side of the hydraulic unit (thus in particular the side connected to the element to be moved or the side comprising the element) is larger than the stroke on the entry side of the hydraulic unit (thus the side connected to the solid-state actuator). In this manner, a larger stroke can be achieved for the actuator device according to the invention than for the individual solid-state actuator. In this manner, the disadvantage of the low maximum stroke, which is present in many such solid-state actuators, can be at least partially compensated for.

In a preferred development of the actuator device according to the invention, the hydraulic unit comprises at least one drive chamber and an output chamber and preferably a hydraulic line connecting drive chamber and output chamber. Alternatively, drive chamber and output chamber can be connected to each other and arranged on each other in direct manner, i.e. without intermediary hydraulic line. The internal spaces of these chambers and optionally of this line then form at least a part of the mentioned hydraulic volume. However, it is not to be excluded -therein that the hydraulic volume additionally includes further parts not mentioned here, in particular further chamber(s) and/or line(s). In addition, the hydraulic volume can in particular be formed with one or more valves between individual constituents of the volume.

Actuator devices with thus configured hydraulic units are particularly well suitable to adjust a predetermined transmission ratio for the hydraulic unit by the respective configuration of the drive chamber and the output chamber. Thus, a comparatively large stroke in the area of the output chamber of the hydraulic unit can in particular be achieved even with low stroke of the solid-state actuator. In other words, a transmission ratio beneficial for arresting can be achieved for the movement of the actuator device by the cooperation between solid-state actuator and hydraulic unit.

In particular, the drive chamber can comprise an associated drive element and/or the output chamber can comprise an associated drive element. These drive and output elements can in particular be piston elements or similarly acting elements, which are conveniently movement-coupled to the solid-state actuators. The drive and output chambers can for example be configured as cylinders or as bellows.

A desired transmission ratio is adjustable in such a hydraulic unit in particular by different shape and/or size of the respective drive and output chambers and/or by different choice of the drive and output elements.

In any case, it is generally preferred if the hydraulic unit comprises at least one drive element partially bounding the drive chamber, which is movable by means of the solid-state actuator. Therein, by moving the drive element, a flow of the hydraulic fluid between drive chamber and output chamber can be effected. The hydraulic unit can additionally comprise at least one drive element partially bounding the output chamber, which is in turn movable by the flowing hydraulic fluid and can move an in particular external, element to be moved on an output side of the hydraulic unit. In particular, by means of the solid-state actuator, preferably by means of the drive element, as previously described, hydraulic fluid is movable from the output chamber into the drive chamber, and/or a pressure reduction of the output chamber can be effected. In this manner, a pressure reduction of the output chamber can be effected by means of control of the solid-state actuator. In particular, the arresting body can be arrested by means of pressurization of the output chamber and the arresting body is releasable by means of a pressure reduction of the output chamber. Accordingly, the arresting body can be released by deflecting the solid-state actuator in this development of the invention.

However, it is generally also possible and advantageous if a transmission ratio greater than 1 is achieved for a movement. This can in particular be advantageous to achieve a particularly high force on the output side (thus the outlet side of the actuator device). This is relevant to the present application with arresting, in which the solid-state actuator is conveniently operated against a fixed end or an end with a very high stiffness.

Optionally, the hydraulic unit of the actuator device according to the invention can additionally comprise a storage chamber for the hydraulic fluid. Preferably, the storage chamber is pressurized, in particular by means of a gas pressure accumulator arranged in the storage chamber and/or by means of a spring applying force to a flexible wall of the storage chamber, i.e. a resilient element.

Preferably, the storage chamber is pressurized in the actuator device according to the invention, wherein the pressurized storage chamber is formed and hydraulically connected for pressurization of the output chamber, in particular by means of pressurization of the drive chamber. In this manner, the pressurized storage chamber can pressurize to the output chamber, in which a pressure reduction can be effected by means of control of the solid-state actuator as described above. Accordingly, by means of this development of the invention, the output chamber can be preloaded such that the arresting body is permanently arrested, for instance clamped or locked, by means of the pressurized output chamber, wherein the arresting body can be released as a result of the pressure reduction of the output chamber in case of need. Ideally, the drive chamber is realized by means of a hydraulic cylinder, in which a hydraulic piston guided in the hydraulic cylinder bounds a drive chamber. Preferably, the hydraulic piston bounds the drive chamber on a side facing the solid-state actuator. In this manner, a deflection of the solid-state actuator can advantageously increase a hydraulic volume of the drive chamber such that the output chamber is reduced in pressure as a result of a flow of hydraulic fluid from the output chamber into the drive chamber. In this development, a pressure reduction in the output chamber can thus be realized such that an arresting body can be released by means of a deflection of the solid-state actuator. In this manner, a so-called "normally-closed" actuator device can be realized, which arrests the arresting body in normal case and releases the arresting body in case of need as a result of control of the solid-state actuator. Suitably, the drive chamber is connected to the storage chamber with a throttle such that a change of the volume of the drive chamber results in a change of the volume of the output chamber and hydraulic fluid does not flow from the storage chamber into the drive chamber or flow back into the storage chamber to appreciable extent. Rather, the connection of the storage chamber to the drive chamber by means of the throttle predominantly serves for preloading pressurization of the drive chamber and thus also of the output chamber.

According to a particularly preferred development of the invention, the mentioned solid-state actuator is a piezo actuator. Piezo actuators have proven to be particularly promising configurations of the solid-state actuator in the past. A particularly precise movement can be achieved by them. Their main disadvantage, namely their low mechanical stroke, can be compensated for by the following hydraulic unit as described.

Particularly preferably, the piezo actuator of the actuator device is formed as a piezo stack actuator. A piezo stack actuator is a series connection basically known from the prior art of multiple individual piezo elements, which are arranged as a layer stack. Such a stack actuator is particularly advantageous to achieve a higher movement amplitude already with the piezo actuator than it would be possible with a single piezo element.

However, the invention is not necessarily restricted to a piezo actuator as the solid-state actuator. Thus, many of the known advantages and disadvantages of piezo actuators also apply to other types of solid-state actuators. For them too, a comparatively low stoke can be increased by the following hydraulic unit. According to a preferred development of the invention, the mentioned solid-state actuator is for example a magnetostrictive actuator or an electrostrictive actuator. Alternatively, the solid-state actuator can also be a shape memory actuator.

In a preferred development of the invention, the actuator device comprises a control device, which is configured to control the solid-state actuator depending on a movement variable of the arresting body. The movement variable is conveniently formed by a location and/or a speed and/or an acceleration of the arresting body. Alternatively or additionally and also preferably, a force application on the arresting body takes the place of the movement variable.

By means of the hydraulic device provided according to the invention in the actuator device, thus, not solely, quasi digitally, arresting forces for a state arresting the arresting body with maximum arresting force and a non-arresting state are adjustable, but all of the intermediate states, in case of arresting in the form of clamping, all of the states between state clamping with maximum clamping force and non-clamping state, are additionally adjustable.

Thus, in case of arresting in the form of clamping, a clamping force decelerating a movable clamping body can in particular be adjusted. Particularly conveniently, the actuator device according to the invention comprises such a control device in a development, which adjusts the solid-state actuator such that the clamping body, after it has been accelerated as a result of canceling the clamping, is decelerated, in particular such that bouncing of the clamping body off a possibly present stop can be avoided.

Preferably, the control device is formed to control a control of the filling of the output chamber and accordingly an adjustment of the decelerating force on the clamping body by means of a feedback by using a movement variable as in particular a speed value and/or an acceleration value and/or a location value of the clamping body or a variable derived therefrom and/or a force application on the arresting body for feedback. In particular, the control device is formed for regulating the clamping force in that the filling of the output chamber and/or the deflection of the solid-state actuator forms the control variable and the speed and/or the acceleration and/or the location of the clamping body and/or a force application on the arresting body forms the reference or regulating variable. Preferably, the regulation is performed after the clamping device has released the clamping body and the spring element has accelerated the clamping body. In particular, the control device is formed to decelerate or debounce the clamping body in controlled manner.

The method according to the invention serves for clamping a clamping body and thereto uses an actuator device according to the invention, wherein the actuator device is formed with a solid-state actuator and a hydraulic unit mechanically connected in series with the solid-state actuator. Therein, the hydraulic unit has a hydraulic volume, which is fillable or filled with a hydraulic fluid. Advantageously, the solid-state actuator is controlled in particular depending on a movement or force variable of the clamping body.

BRIEF DESCRIPTION OF THE DRAWINGS

Below, the invention is explained in more detail based on embodiments illustrated in the drawings. The drawings show.

DESCRIPTION OF THE PREFERRED EMBODIMENTS

Figure 1:
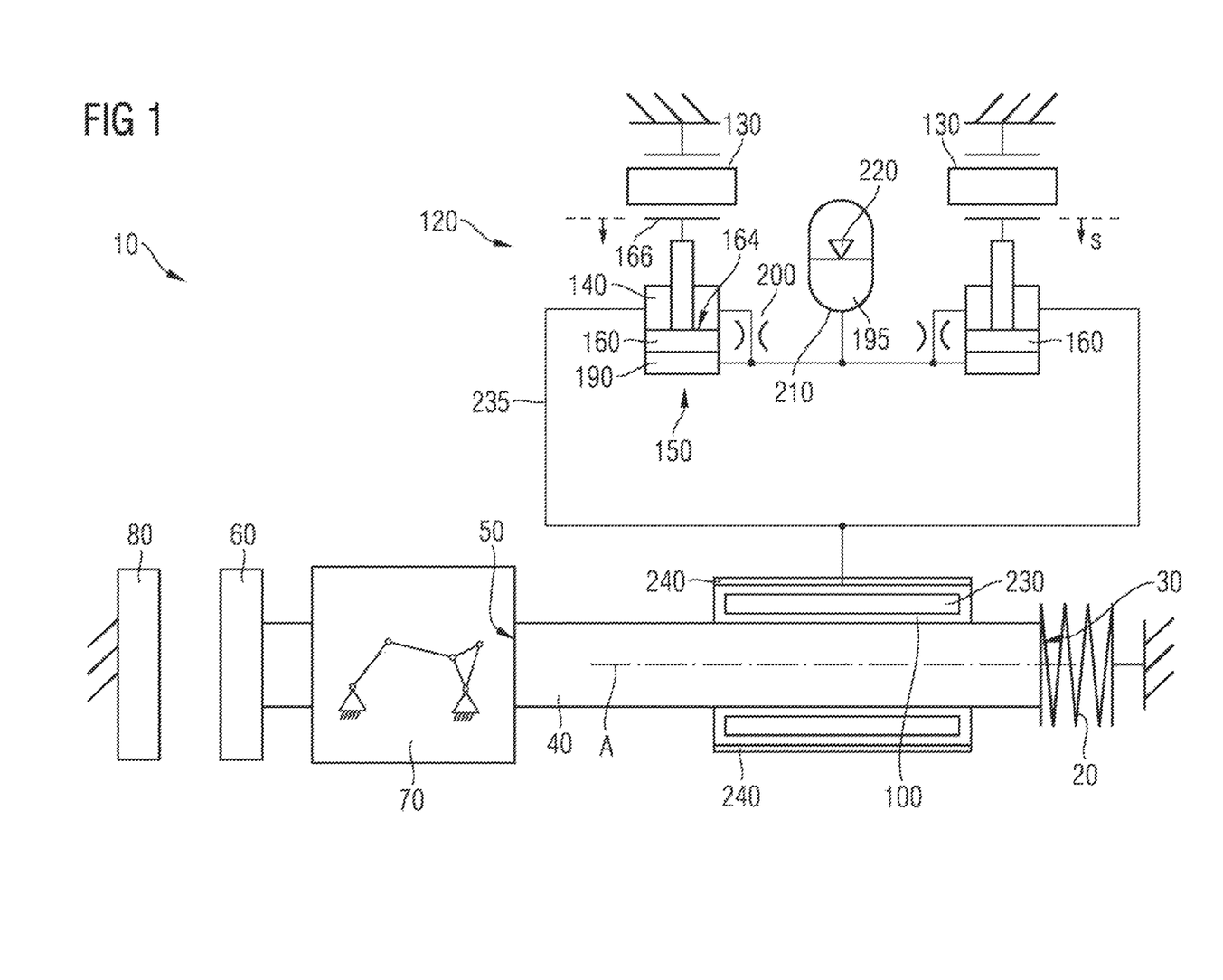
FIG. 1 schematically a first embodiment of an actuator device according to the invention with a hydraulic unit in a schematic diagram, FIG. 2 schematically a second embodiment of an actuator device according to the invention with a hydraulic unit in a schematic diagram, as well as FIG. 3 schematically a third embodiment of an actuator device according to the invention with a hydraulic unit in a schematic diagram.

The drawing in FIG. 1 schematically shows a first embodiment of an actuator device according to the invention with a hydraulic unit in a schematic diagram.

As illustrated in FIG. 1, the actuator device 10 according to the invention includes a spring element 20, presently for example a compression spring in the form of a coil spring, which is arranged on a front side 30 of a circularly cylindrical shaft 40 and applies a force on the shaft 40 on this front side 30 in axial direction A. A transmission unit 70 can be present, which transmits a path of the shaft 40 into a path of an actuator element 60, with a transmission factor greater than one in the shown embodiment, i.e. a movement of the shaft 40 is transmitted into a path of the actuator element 60 greater by this transmission factor. In the shown embodiment, the transmission unit 70 comprises a contact compression spring. However, in further, not specifically illustrated embodiments, the transmission unit 70 can also be formed in other manner.

The actuator element 60 is movable against a mechanical stop 80. In contrast to the actuator element 60 movable by the transmission unit 70, the mechanical stop 80 is fixed. If actuator element 60 and mechanical stop 80 abut on each other, thus, the actuator device 10 is in an immobilized state. If actuator element 60 and mechanical stop 80 are spaced from each other, thus, the actuator device 10 is in an operating state. Actuator element 60 and mechanical stop 80 can basically be configured in different manner. In the illustrated embodiment, the actuator element 60 and mechanical stop 80 are configured as plates. However, actuator element 60 and mechanical stop 80 can basically also be formed in other manner.

In the situation illustrated in FIG. 1, the actuator element 60 is spaced from the mechanical stop 80, i.e. the actuator device 10 is in an operating state.

The spring element 20 is compressed in axial direction A in preloading manner and is prevented from its relaxation as a result of an arrest of the shaft 40 in axial direction A. The shaft 40 is fixed in axial direction A by means of a clamping jaw 100, which is applied with force in radial direction towards the shaft 40 and frictionally retains the shaft 40 in its axial position.

The clamping jaw 100 is formed to be able to interrupt the force application on the shaft 40 and to be able to axially release the shaft 40. As a result of release of the shaft 40, the spring element 20 can relax and apply a force on the shaft 40 in axial direction A. Due to the force application on the shaft 40 by means of the spring element 20, the shaft 40 is movable in axial direction A such that the actuator element 60 is movable towards the mechanical stop 80 and the actuator device can be immobilized.

The clamping jaw 100 is part of a hydraulic unit 120, by means of which the clamping jaw 100 is movably operable in controlled manner as described below:

The hydraulic unit 120 forms a clamping device with the clamping jaw 100 and the shaft 40 clampable by means of the clamping jaw 100 for ultra-fast pressure reduction.

As illustrated in FIG. 1, the hydraulic unit 120 comprises a solid-state actuator 130, which is formed by a piezo actuator in the shown embodiment.

In the shown embodiment, this solid-state actuator 130 is coupled by means of a drive chamber 140 of a double-acting hydraulic cylinder 150 in the form of a piston cylinder. In this context, coupled means that the solid-state actuator 130 is connected to a boundary of the drive chamber 140 of the hydraulic cylinder 150 such that the drive chamber 140 changes its volume as a result of a deflection of the solid-state actuator 130. In the shown embodiment, the drive chamber 140 of the piston cylinder is limited in volume by a hydraulic piston 160 displaceable in axial direction of the piston cylinder in the piston cylinder in a manner known per se and the solid-state actuator 130 is connected to the hydraulic piston 160 in movement-coupled manner, for instance to a handle 166 arranged on a front side 164 of the hydraulic piston 160 in form-fit manner. In further, not specifically illustrated embodiments, a hydraulic cylinder 150 in the form of a metallic bellows is present instead of the piston cylinder, which has a movable front side, which is movement-coupled to the solid-state actuator 130.

Basically, the hydraulic cylinder 150 can also be realized in other manner. It is in particular essential according to the invention that a hydraulic drive volume is changed by means of a movement of the solid-state actuator 130.

In the shown embodiment, the hydraulic piston 160 separates two volumes. The drive volume of the drive chamber 140 abuts on a front side of the hydraulic piston 160 close to the solid-state actuator 130, i.e. upon deflection of the solid-state actuator 130 in the direction towards the hydraulic piston 160, the drive volume of the drive chamber 140 increases in its magnitude.

A further volume 190 of the hydraulic cylinder 150 abuts on a side of the hydraulic piston 160 far from the solid-state actuator 130.

Drive volume of the drive chamber 140 and further volume 190 of the hydraulic cylinder 150 are filled with a hydraulic fluid 195. Basically, the hydraulic fluid 195 can be formed by water or by another liquid. In the illustrated embodiment, the hydraulic fluid 195 is formed by a liquid metal, for example Galinstan. Liquid metal has a particularly low compressibility and a particularly low thermal expansion coefficient.

The further volume 190 is connected to the drive volume via a leakage always present in practice. The leakage is symbolized by a throttle 200 connected in parallel with the hydraulic piston 160 in FIG. 1.

The further volume 190 is connected to a reservoir 210 filled with hydraulic fluid 195 in fluid conducting manner. The reservoir 210 is preloaded by means of a pressurization means 220, i.e. pressurized with a pressure, here an overpressure. As a result of the leakage, not solely the further volume 190, but the entire hydraulic unit 120, i.e. in particular also the drive volume of the drive chamber 140, is pressurized with the overpressure.

In the illustrated embodiment, the pressurization means 220 is a gas pressure accumulator located in the reservoir 210. In further, not specifically illustrated embodiments, the pressurization means 220 can also be formed by a spring, which applies force on a flexible wall of the reservoir such that the reservoir 210 is pressurized.

The drive chamber 140 is connected to an output chamber 230 by means of fluid lines 235 in fluid conducting manner, in which a pressure drop can be realized for realizing clamping of the shaft 40:

If the solid-state actuator 130 is abruptly controlled, i.e. by means of a voltage pulse, thus, the solid-state actuator 130 is deflected in direction s and axially drives the handle 166 of the hydraulic piston 160. Thereby, hydraulic fluid 195 is displaced into the reservoir 210. Since the pressurization means 220 has a lower spring stiffness compared to the hydraulic fluid 195, the pressure increase is low as a result of the low expansion of the solid-state actuator 130. As a result of the deflection of the hydraulic piston 160, however, a volume change in the hydraulic output chamber 230 occurs.

Therein, the pressure drop is proportional to the quotient of relative volume change and compressibility of the hydraulic fluid:

Therein, the relative volume change means the volume change related to an initial volume before the volume change.

The absolute volume change is preset by the solid-state actuator 130 in the illustrated embodiment. In order to achieve a pressure drop as high as possible, the hydraulic initial volume is kept as low as possible and a hydraulic fluid 195 with particularly low compressibility is selected for a high pressure drop.

The thermal expansion coefficient of a liquid metal like Galinstan is 0.000126 1/K and thereby only a fifth of glycerin and only half of water. Thereby, the temperature-related influence on the pressure in the output chamber 230 can be reduced.

The lower the initial volume and compressibility are, the less energy has to be provided by the solid-state actuators 130 to realize a certain pressure drop.

In addition, the solid-state actuator 130 with the hydraulic drive chamber, as illustrated in FIG. 1, can be provided two times or multiple times for a pressure drop as high as possible as in the shown embodiment.

The output chamber 230 of the hydraulic unit 120 has a shape of a circularly cylindrical pipe, which fully circumferentially surrounds the shaft 40 along an axial section. The output chamber 230 is introduced into a circumferential pipe 240 and accordingly fixed on the outer circumference. As a result of inflowing hydraulic fluid 195, an inner diameter of the output chamber 230 of the hydraulic unit 120 can be reduced such that the output chamber 230 frictionally abuts on the shaft 40 around it depending on inflowing hydraulic fluid 195.

The part of the surface of the output chamber 230 capable of being abutted on the shaft 40 forms the above mentioned clamping jaw 100 of the actuator device 10 according to the invention. By means of this clamping jaw 100, the shaft 40 can be fixed in force-fit manner: As a result of the original initial pressure in the hydraulic system, the clamping jaw 100 is applied with force towards the shaft 40 such that the shaft 40 is clamped in the initial state.

In case of need, for instance a critical state of a system provided with the actuator device 10 according to the invention, the shaft 40 is to be released from the clamping jaw 100, such that the spring element 20 can relax and accelerates the shaft 40 in axial direction A. As previously described, the spring element 20 is formed as a mechanical compression spring. Alternatively, a compressed gas spring or another spring element 20 is present instead of a mechanical compression spring.

In case of a critical state, the shaft 40 clamped in the clamping jaw 100 heretofore can be released by controlling the solid-state actuator or—in case of multiple solid-state actuators 130 connected in parallel—actuators 130 to effect a pressure decrease in the output chamber 230. Thereby, the clamping between the clamping jaw 100 and the shaft 40 is releasable and the shaft can be accelerated due to the spring element 20. In this manner, the shaft 40 is movable with particularly low time delay.

It is understood that in further, not specifically illustrated embodiments, an electromechanical drive can be provided instead of the spring element 20, wherein the drive energy is for example held available in capacitors.

By means of the hydraulic device 120 provided according to the invention in the actuator device 10, in addition, not solely, quasi digitally, clamping forces for a state clamping the shaft 40 with maximum clamping force and a state not clamping the shaft 40 are adjustable, but all of the states between state clamping with maximum clamping force and non-clamping state are additionally adjustable: Thus, a clamping force decelerating the shaft 40 in axial direction A can in particular be adjusted. Not specifically illustrated in the drawing, a control device is present, which adjusts the solid-state actuators 130 such that the shaft 40, after it has been released from the clamping jaw 100, is decelerated, namely such that bouncing of the actuator element 60 off the fixed mechanical stop 80 can be avoided. The control device is formed to control a control of filling of the output chamber 230 and thus an adjustment of the decelerating force on the shaft 40 by the clamping jaw 100 by means of feedback by using an acceleration value as well as a speed and a location value of the shaft 40 for feedback. Therein, the clamping force is adjusted by means of filling the output chamber 230 such that the shaft 40 is abruptly decelerated upon its abutment of the actuator element 60 on the mechanical stop 80. Preferably, this regulation is only performed after the clamping jaw 100 has released the shaft 40 and the spring element 20 has accelerated the shaft 40.

In the shown embodiment, the actuator device 10 is formed for accelerating the shaft 40 in the direction of the mechanical stop 80. Basically, the actuator device 10 can also be formed for removing the shaft 40 from the mechanical stop 80, for example by corresponding arrangement of the spring element 20 on the shaft 40.

Figure 2:
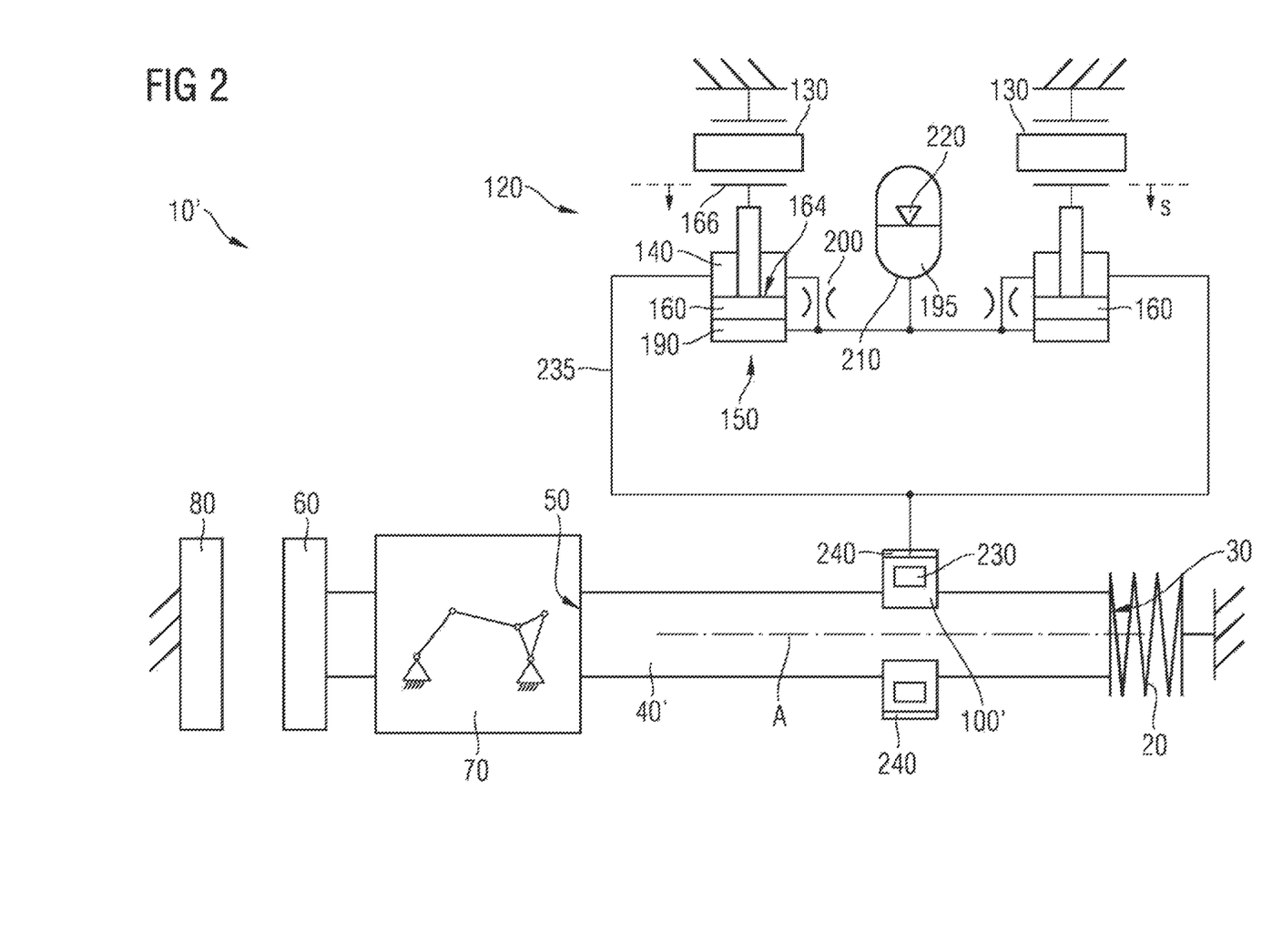

The further embodiment of an actuator device 10' according to the invention illustrated in FIG. 2 largely corresponds to the embodiment of an actuator device 10 according to the invention illustrated in FIG. 1.

However, departing from the previously described embodiment, the actuator device 10' comprises a shaft 40' clampable by a latch 100' instead of a shaft 40 clampable by a clamping jaw 100. Thereto, the shaft 40' comprises a fully circumferentially extending constriction 42', which forms a recess, with which the latch 100' can engage. The latch 100' is formed as a radially inwards extending projection arranged fully circumferentially on an inner circumference of the output chamber 230, which accordingly radially protrudes into the recess 42'. Thereto, the output chamber 230 has dimensions shorter in axial direction compared to the preceding embodiment.

In this manner, the latch 100' can be introduced into the recess 42' by means of filling the output chamber 230 and be removed from the recess 42' by means of pressure reduction and thus evacuation of the output chamber 230.

Correspondingly, the shaft 40' is fixable by means of the latch 100' in form-fit manner in this embodiment shown in FIG. 2.

The embodiment of an actuator device 10" according to the invention illustrated in FIG. 3 corresponds to the previously described embodiment of the actuator device 10' according to the invention except for the circumstance described below. Therein, the latch 100' additionally comprises a transmission 270, which provides a movement of an inner circumference of the output chamber 230 with a transmission factor, such that the latch 100' is not directly moved, but is moved in transmitted manner corresponding to the transmission factor.

Figure 3:
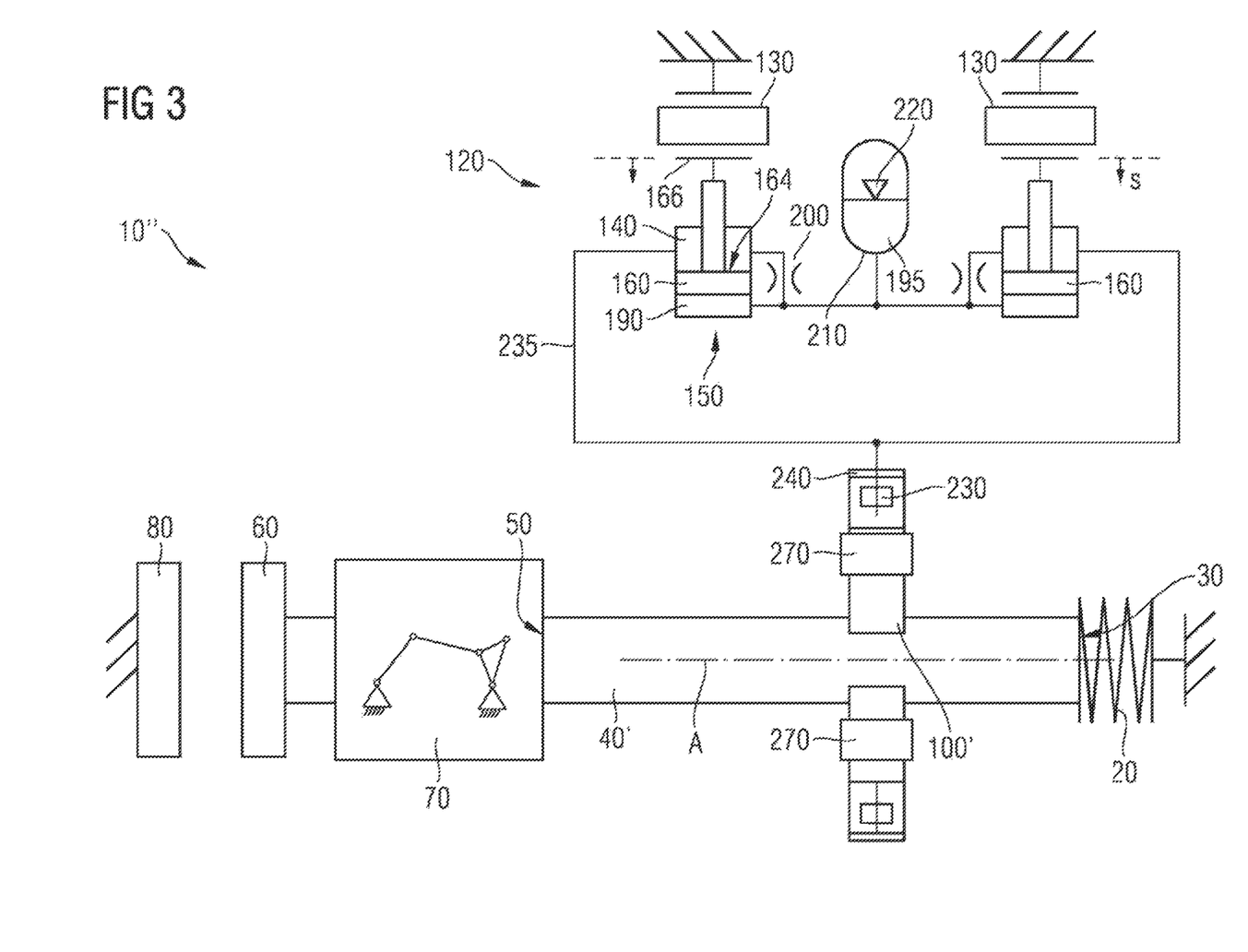

In case of the embodiments illustrated based on FIGS. 1 to 3, they are so-called "normally closed" actuator devices, i.e. the shafts 40, 40' are permanently fixed, thus arrested, in the operating state. The shafts 40, 40' are only released and accelerated by means of the spring element 20 in case of need, for instance a critical state.

Basically, actuator devices can also be formed as "normally open" actuator devices in further, not specifically illustrated embodiments, in which the shafts are only fixed in case of need, usually an exceptional case.

The invention claimed is:

1. An actuator device comprising:
   a solid-state actuator;
   and a hydraulic unit mechanically connected in series with the solid-state actuator;
   wherein the hydraulic unit has a hydraulic volume, which is filled with a hydraulic fluid;
   wherein the hydraulic unit comprises at least one drive chamber, an output chamber, and a hydraulic line connecting the at least one drive chamber and the output chamber;
   wherein the hydraulic unit comprises at least one drive element partially bounding the at least one drive chamber, the at least one drive element being movable by the solid-state actuator, wherein by moving the at least one drive element, a flow of the hydraulic fluid between the at least one drive chamber and the output chamber can be effected;
   wherein the solid-state actuator is a magnetostrictive actuator, an electrostrictive actuator, a piezo actuator, or a shape memory actuator;
   wherein the hydraulic fluid is or comprises a eutectic alloy that is liquid at normal pressure at a temperature of 0° C.;
   wherein the actuator device is formed for arresting in the form of clamping and comprises an arrested body which can be arrested by the hydraulic unit, wherein the arrested body is clampable by the hydraulic unit;
   wherein the actuator device comprises at least one clamping surface formed for frictional engagement with the arrested body formed as a clamped body;
   wherein the actuator device is formed to circumferentially clamp the clamped body;
   wherein the at least one drive element separates two volumes that are filled with hydraulic fluid and that are connected to one another by a leakage.

2. The actuator device according to claim 1, further comprising:
   a spring element, which is arranged and formed for force application on the arrested body.

3. The actuator device according to claim 1, wherein the hydraulic unit is formed to transmit a movement originating from the solid-state actuator to an element to be moved with a transmission ratio unequal to one.

4. The actuator device according to claim 1, wherein the hydraulic unit further comprises a storage chamber for the hydraulic fluid.

5. The actuator device according to claim 4, wherein the storage chamber is pressurized, wherein the pressurized storage chamber is formed and hydraulically connected for pressurizing the output chamber.

6. The actuator device according to claim 1, wherein a control device is present, which is configured to control the solid-state actuator depending on a movement variable of the arrested body and/or a force application on the arrested body.

7. The actuator device according to claim 1, wherein the eutectic alloy comprises gallium.

8. The actuator device according to claim 1, wherein the eutectic alloy comprises indium.

9. The actuator device according to claim 1, wherein the eutectic alloy comprises tin.

10. A method for operating an actuator device comprising:
providing an arrested body;
providing a solid-state actuator and a hydraulic unit mechanically connected in series with the solid-state actuator, wherein the hydraulic unit has a hydraulic volume, which is filled with a hydraulic fluid;
controlling the solid-state actuator depending on a movement and/or force variable of and/or force application on the arrested body;
wherein the hydraulic unit comprises at least one drive chamber, an output chamber, and a hydraulic line connecting the at least one drive chamber and the output chamber;
wherein the hydraulic unit comprises at least one drive element partially bounding the at least one drive chamber, the at least one drive element being movable by the solid-state actuator, wherein by moving the at least one drive element, a flow of the hydraulic fluid between the at least one drive chamber and the output chamber can be effected;
wherein the solid-state actuator is a magnetostrictive actuator, an electrostrictive actuator, a piezo actuator, or a shape memory actuator;
wherein the hydraulic fluid is or comprises a eutectic alloy that is liquid at normal pressure at a temperature of 0° C.;
wherein the actuator device is formed for arresting in the form of clamping and comprises an arrested body which can be arrested by the hydraulic unit, wherein the arrested body is clampable by the hydraulic unit;
wherein the actuator device comprises at least one clamping surface formed for frictional engagement with the arrested body formed as a clamped body;
wherein the actuator device is formed to circumferentially clamp the clamped body;
wherein the at least one drive element separates two volumes that are filled with hydraulic fluid and that are connected to one another by a leakage.

* * * * *